(12) United States Patent
Fujita (10) Patent No.: US 10,924,073 B2
(45) Date of Patent: Feb. 16, 2021

(54) TRANSMISSION DEVICE AND TRANSMISSION/RECEPTION SYSTEM

(71) Applicant: THINE ELECTRONICS, INC., Tokyo (JP)

(72) Inventor: Yusuke Fujita, Tokyo (JP)

(73) Assignee: THINE ELECTRONICS, INC., Tokyo (JP)

( * ) Notice: Subject to any disclaimer, the term of this patent is extended or adjusted under 35 U.S.C. 154(b) by 2 days.

(21) Appl. No.: 16/164,151

(22) Filed: Oct. 18, 2018

(65) Prior Publication Data
US 2019/0123700 A1 Apr. 25, 2019

(30) Foreign Application Priority Data
Oct. 19, 2017 (JP) .............................. JP2017-202673

(51) Int. Cl.
*H03F 3/45* (2006.01)
*H03F 3/24* (2006.01)

(52) U.S. Cl.
CPC ......... *H03F 3/45192* (2013.01); *H03F 3/245* (2013.01); *H03F 3/45475* (2013.01); *H03F 2203/45212* (2013.01); *H03F 2203/45702* (2013.01)

(58) Field of Classification Search
CPC .. H03F 3/45192; H03F 3/45475; H03F 3/245; H03F 2203/45212; H03F 2203/45702; H04B 3/50; H04B 3/02
USPC ........................................................ 326/21
See application file for complete search history.

(56) References Cited

U.S. PATENT DOCUMENTS

| 8,144,726 B2* | 3/2012 | Xu | G06F 13/4295 370/236 |
| 9,887,710 B1* | 2/2018 | Lim | H03M 9/00 |
| 10,575,815 B2* | 3/2020 | Corl | A61B 8/4483 |
| 2009/0300562 A1* | 12/2009 | Xu | G06F 13/4295 716/106 |
| 2013/0007489 A1* | 1/2013 | Unnikrishnan | G06F 1/3209 713/320 |
| 2014/0187960 A1* | 7/2014 | Corl | A61B 8/0891 600/466 |
| 2020/0014376 A1* | 1/2020 | Joly | H03F 3/45192 |

FOREIGN PATENT DOCUMENTS

| JP | 5349842 B2 | 11/2013 |
| JP | 2016163247 A | 9/2016 |

\* cited by examiner

*Primary Examiner* — Don P Le
(74) *Attorney, Agent, or Firm* — Sughrue Mion, PLLC (57) ABSTRACT

A transmission/reception system 1 includes a transmission device 10 and a reception device 20 that is connected to each other through differential signal lines 30 and a signal line 40, and receives a differential signal that is sent out from the transmission device 10 using the reception device 20. The transmission device 10 includes a signal output unit 11, a request input unit 12, and a resistor 13. The signal output unit 11 sends out a differential signal from a pair of output terminals $P_{111}$ and $P_{112}$ that are connected to the differential signal lines 30. A common voltage of each of the pair of output terminals $P_{111}$ and $P_{112}$ is constant over a state where no electric power is supplied and an idle state.

14 Claims, 6 Drawing Sheets

TRANSMISSION DEVICE AND TRANSMISSION/RECEPTION SYSTEM

TECHNICAL FIELD

The present invention relates to a transmission device and a transmission/reception system.

BACKGROUND

In a transmission/reception system that comprises a transmission device and a reception device connected to each other via differential signal lines, a signal input unit of the reception device inputs differential signals sent from the transmission device, and the signal input unit generates data by sampling the differential signals at a timing that is designated by a clock. When high-speed differential transfer is performed by the transmission/reception system, the differential signals are attenuated or reflected. Thus, a margin of differential signal sampling in a signal input unit of the reception device decreases.

An offset at the time of the differential signal sampling in the signal input unit of the reception device is adjusted, and thus the margin of the differential signal sampling can be increased. The offset is a deviation from a threshold when making a determination (a determination of a default value) of whether the differential signal that is input is a logical value of 1 or a logical value of 0. The offset occurs due to a variation of a characteristic of each device that constitutes a circuit, but can be adjusted by devising a circuit of the signal input unit. The closer the default is to 0, the more preferable the default.

According to the invention that is disclosed in Patent Document 1 that will be described below; as a state where a pair of s that forms differential signal lines in an input terminal of a reception device is short-circuited, an offset is detected based on data that is obtained with different signal sampling, and the offset is adjusted based on a result of the detection.

According to the invention that is disclosed in Patent Document 2, a signal containing information to the effect that an offset adjustment starts to be made in a reception device is sent from the reception device to a transmission device, and thereafter, differential signals of a differential 0 V is sent from the transmission device to the reception device. Then, in the reception device into which the differential signals of differential 0 V is input, an offset is detected based on data that is obtained with differential sampling, and the offset is adjusted based on a result of the detection.

Patent Document 1: Japanese Patent No. 5349842
Patent Document 2: Japanese Unexamined Patent Publication No. 2016-163247

SUMMARY

However, according to the invention disclosed in Patent Document 1, because there is a need for a switch for short-circuiting the differential signal lines in input terminals of the reception device, a load capacity of the input terminal increases and this has an adverse effect on high-speed differential transfer. Furthermore, because there is a need for a switch or the like for detecting the offset, a circuit area of, and power consumption by, the reception device increases. Moreover, when a state is reached where the switch is closed in the input terminal of the reception device and thus the differential signal lines are shalt-circuited, if a signal is sent out from the transmission device, in some cases, the signal is noise for the reception device, According to the invention that is disclosed in Patent Document 2, the above-described problem with the invention that is disclosed in Patent Document 1 can be solved. However, according to the invention that is disclosed in Patent Document 2, the signal containing the information to the effect that the Whet adjustment starts to be made in the reception device is sent from the reception device to the transmission device, and thereafter, in some cases, a state of the transmission device changes and thus a common voltage for the differential signals that are input into the reception device changes. Moreover, in some cases, when the common voltage changes, the differential signals do not satisfy differential 0 V. In such a case, in the reception device, the offset adjustment is made based on a result of performing the sampling on the differential signals that do not satisfy differential 0 V and thus, in some cases, a precise offset adjustment cannot be made.

As the state of the transmission device, in addition to a normal data transmission state in which normal data is output as the differential signals, there are a state where no electric power is supplied and an idle state. Furthermore, there is also a powered-down state for the transmission device. The state where no electric power is supplied is a state where power is not supplied to the transmission device. The idle state is a state where no electric power is supplied to the transmission device and a state where the differential signals of differential 0 V are output. In some cases, the differential 0 V is induced in a manner that is actively fixed to certain potential, and in other cases, the differential 0 V is induced in a manner that is output with high impedance and is passively fixed by a link to certain potential. The powered-down state is a state where no electric power is supplied to the transmission device and a state where there is less power consumption than in the idle state.

For example, when the transmission device changes from the state where no electric power is supplied to the powered-down state or the idle state, if timings at which power starts to be supplied to constituent elements that are included in each transmission device are different from each other, in some cases, the common voltage changes. Furthermore, when the transmission device changes from the powered-down state from the idle state, if timings at which constituent elements that are included in each transmission device transition from a low power consumption state to a normal power consumption state are different from each other, in some cases, the common voltage changes as well. When the common voltage changes, in some cases, the differential signals are not at the differential 0 V.

In many cases, the reception device cannot know in which state the transmission device is. For example, in the transmission/reception system that transfers image data from the transmission device to the reception device, in many cases, emphasis is placed on high-speed transfer of a large amount of image data in one direction from the transmission device to the reception device, and a subchannel for sending the state of the transmission device to the reception device is provided. In this case, the reception device can neither know the state of the transmission device and the change in the state, nor know a change in the common voltage in a predictive manner. Therefore, in some cases, although the differential signals do not satisfy the differential 0 V, the reception device makes an offset adjustment, but cannot make a precise offset adjustment.

An object of the present invention, which was made to solve the problems described above, is to provide a transmission device that is capable of making an offset adjustment in a reception device although a state changes, and a transmission/reception system that includes the transmission device and the reception device.

According to a first aspect of the present invention, there is provided a transmission device including a signal transmitter (a signal output unit) configured to send out differential signals from a pair of output terminals that are connected to differential signal lines, in which a common voltage of the pair of output terminals is constant over a state where no electric power is supplied and an idle state. Furthermore, it is preferable that the common voltage of the pair of output terminals is constant over the state where no electric power is supplied, a powered-down state and the idle state.

According to a second aspect of the present invention, there is provided a transmission device including a signal transmitter (a signal output unit) configured to send out a differential signal from a pair of output terminals that are connected to a differential signal line, in which the signal transmitter includes a current mode driver, and a common voltage of each of the pair of output terminals is constant over a state where no electric power is supplied and a powered-down state.

According to a third aspect of the present invention, there is provided a transmission device including: a signal transmitter (a signal output unit) configured to send out differential signals from a pair of output terminals that are connected to differential signal lines, in which the signal output unit includes a voltage mode driver and a common voltage of the pair of output terminals is constant over a powered-down state and an idle state.

It is preferable that the transmission device according to the present invention further includes a request receiver (a request input unit) configured to be a receiver into which to input a request signal that makes a request to send out the differential signals for adjusting an offset when differential signal sampling is performed in a reception device that is connected through the differential signal lines, in which the signal transmitter sends out differential signals of a differential 0 V to the reception device based on the request signal that is input into the request receiver.

A transmission/reception system according to the present invention includes the transmission device according to the present invention, and a reception device that is connected to the transmission device through differential signal lines. The reception device includes (1) a signal receiver (a signal input unit) configured to be a receiver into which to input differential signals that are sent out from the transmission device to the differential signal lines and configured in such a manner that data is generated by performing sampling on the differential signals at a timing that is designated by a clock, and an offset is adjustable at the time of the differential signal sampling, and (2) an offset adjuster (an adjustment unit) configured to adjust the offset based on data that is output from the signal receiver, when differential signals satisfying differential 0 V that is sent out from the transmission device are input into the signal input unit.

Alternatively, a transmission/reception system according to the present invention includes the transmission device according to the third aspect of the present invention, and a reception device that is connected to the transmission device through differential signal lines. The reception device includes (1) a signal receiver (a signal input unit) configured to be a receiver into which to input differential signals that are sent Out from the transmission device to the differential signal lines and configured in such a manner that data are generated by sampling the differential signals at a timing that is designated by a clock, and an offset is adjustable at the time of the differential signal sampling, (2) a request transmitter (a request output unit) configured to send out a request signal that makes a request to the transmission device to send out a differential signal for adjusting the offset, to the transmission device, and (3) an offset adjuster (an adjustment unit) configured to adjust the offset based on data that is output from the signal input unit, when differential signals with differential 0 V that are sent out from the transmission device are input into the signal input unit, after the request transmitter sends out the request signal.

It is preferable that, in the transmission/reception system according to the present invention, when the differential signals with differential 0 V that are sent out from the transmission device are input into the signal input unit, the offset adjuster of the reception device adjusts the offset in such a manner that data having a logical value of 1 and data having a logical value of 0 are output, with the same frequency of occurrence, by the differential signal sampling in the signal input unit.

It is preferable that the transmission/reception system according to the present invention further includes a signal line for transmitting a request signal from the reception device to the transmission device, the signal line being connected to a first reference potential terminal through a resistor on the transmission device side, and being connected to a second reference potential terminal through a switch on the reception device side. The request signal is transmitted by the reception device in response to an opened or closed state of the switch. Furthermore, it is preferable that an excessive line that makes a space between the differential signal lines is preferably used as the signal line that transmits the request signal from the reception device to the transmission device, the excessive line transmitting the differential signals from the transmission device to the reception device.

According to the present invention, although the state of the transmission device changes, a precise offset adjustment is possible in the reception device.

DETAILED DESCRIPTION

Embodiments of the present invention will be described below with reference to the accompanying drawings. It is noted that the same element is the same reference numeral and thus that the same descriptions are not repeated. The scope of the present invention is determined by claims without being limited to this exemplary description, and is intended to include all modifications that fall equivalently within the meaning and scope of claims.

Figure 1:
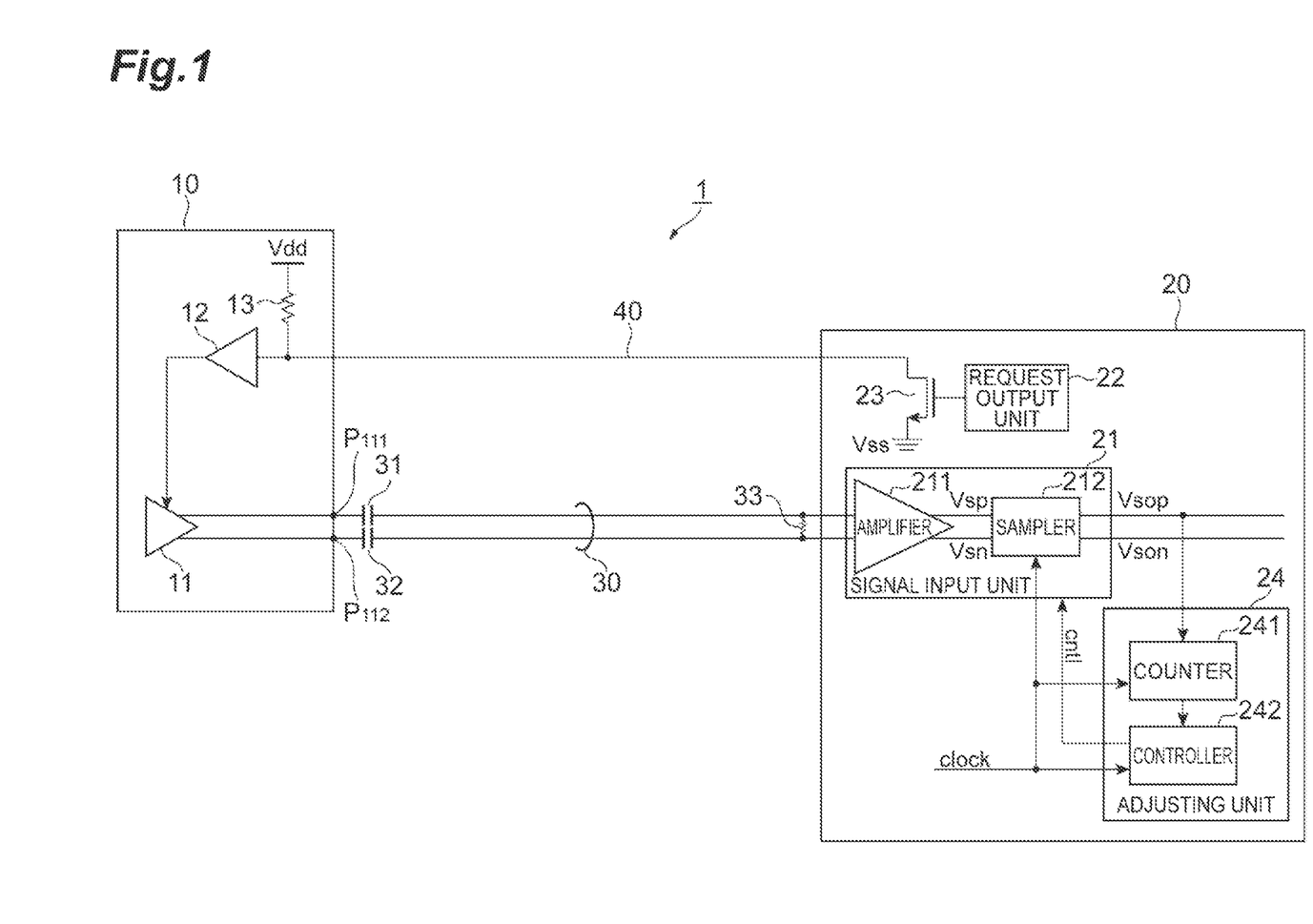
FIG. 1 is a diagram illustrating a configuration of a transmission/reception system 1.

FIG. 1 is a diagram illustrating a configuration of a transmission/reception system 1. The transmission/reception system 1 includes a transmission device 10 and a reception device 20 that is connected to each other by differential signal lines 30 and a signal line 40, and receives differential signals that is sent out from the transmission device 10 using the reception device 20.

The transmission device 10 includes a signal output unit 11 (a signal transmitter), a request input unit 12 (a request receiver), and a resistor 13. A request signal that is sent from the reception device 20 through the signal line 40 is input into the request input unit 12. The resistor 13 is provided between an input terminal (that is, the signal line 40) of the request input unit 12 and a first reference potential terminal. The first reference potential terminal is given power supply potential Vdd. The signal output unit 11 sends out differential signals from a pair of output terminals $P_{111}$ and $P_{112}$ that are connected to the differential signal lines 30, to the reception device 20.

Based on the request signal that is input into the request input unit 12, the signal output unit 11 can send out differential signals of a differential 0 V from the output terminals $P_{111}$ and $P_{112}$, respectively, to the reception device 20. Furthermore, with a state, the signal output unit 11 can send out differential signals of a differential 0 V from the output terminals $P_{111}$ and $P_{112}$ to the reception device 20, not based on the request signal. The signal output unit 11 will be described in detail below.

The reception device 20 includes a signal input unit 21 (a signal receiver), a request output unit 22 (a request transmitter), a switch 23, and an adjustment unit 24 (an offset adjuster). The differential signals that are sent from the signal output unit 11 of the transmission device 10 through the differential signal lines 30 is input into the signal input unit 21, and the signal input unit 21 performs sampling on the differential signals at a timing that is designated by a clock and generates digital data. Furthermore, it is possible that an offset at the time of differential signal sampling in the signal input unit 21 is adjusted.

The signal input unit 21 includes an amplifier 211 (amplifier) and a sampler 212 (sampler). The amplifier 211 amplifies the differential signals that arrive by way of the differential signal lines 30 and outputs the resulting signals. The sampler 212 performs sampling on differential signals Vsp and Vsn that result from the amplification by the amplifier 211, based on a clock, and generates data Vsop and data Vson, respectively. Any of the amplifier 211 and the sampler 212 may be adjustable.

Vsop and Vson are pieces of digital data that are values which are complementary to each other. One of the two values is a logical value of 1 and the other is a logical value of 0. The clock may be a clock that is sent and arrives, separately from data, from the transmission device 10. In a case where the signal that is sent from the transmission device 10 is a signal, pieces of data of which carry clock information, the clock may be a clock that results from restoration in the reception device 20, based on the signal.

The request output unit 22 sends the request signal to the transmission device 10 through the signal line 40. The request signal is a signal that requests the transmission device 10 to send out the differential signal for adjusting the offset at the time of the differential signal sampling in the signal input unit 21. The switch 23 is provided between the signal line 40 and a second reference potential terminal. The second reference potential terminal is given ground potential $V_{SS}$.

When the switch 23 is closed, potential of the signal line 40 is second reference potential (the ground potential $V_{SS}$). When the switch 23 is opened, the potential of the signal line 40 is first reference potential (the power supply potential Vdd). That is, based on the opened or closed state of the switch 23 the request output unit 22 can send the request signal to the transmission device 10. The switch 23, for example, is configured with a MOS transistor, and in such a case, the opened or closed state of the switch 23 is set according to how great a gate voltage is.

A configuration in which the signal line 40, the resistor 13, and the switch 23 are included may be the same as a configuration in which a hot plug detection function is realized. That is, when a cable/connector is disconnected from the transmission device 10 and the reception device 20, or when the reception device 20 is powered down, the potential of the signal line 40 is the first reference potential (the power supply potential Vdd). When the cable/connector connects between the transmission device 10 and the reception device 20 and thus the reception device 20 is operable, the potential of the signal line 40 is the second reference potential (the ground potential $V_{SS}$). The transmission device 10 detects a potential level of the signal line 40, and thus can know whether or not the reception device 20 is in a state of being able to receive a signal. The transmission device 10 checks that the reception device 20 is in the state of being able to receive a signal, and then can transmit the signal to the reception device 20.

When the differential signals of a differential 0 V, which is sent out and arrives from the signal output unit 11 of the transmission device 10 based on the request signal which is sent out from the request output unit 22 to the transmission device 10, is input into the signal input unit 21, the adjustment unit 24 adjusts the offset at the same time of the differential signal sampling in the signal input unit 21, based on data that is output from the signal input unit 21. Preferably, the adjustment unit 24 adjusts an offset in such a manner that data having a logical value of 1 and data having a logical value of 0 are output, with the same frequency of occurrence, with the differential signal sampling in the signal input unit 21.

The adjustment unit 24 includes a counter 241 and a controller 242. Not only data that is output from the signal input unit 21, but also a clock is input into the counter 241. Over a constant duration, the counter 241 counts events in which the output data has a logical value of 1, and counts events in which the output data has a logical value of 0. Alternatively, over a constant duration, the counter 241 increases a counting value by 1 in a case where the output data has a logical value of 1, and decreases the counting value by 1 in a case. Where the output data has a logical value of 0. Thus, the counter 241 obtains a difference between the number of events in which the output data has a logical value of 1 and the number of events in which the output data has a logical value of 0.

Not only a result of the counting by the counter 241, but also a clock is input into the controller 242 (controller). Based on the result of the counting in accordance with a digital value cntl, the controller 242 determines the digital value cntl in such a manner that the data having a logical value of 1 and the data having a logical value of 0 are output, with the same frequency of occurrence, with the differential signal sampling in the signal input unit 21. The controller 242 outputs the digital value cntl to the signal input unit 21. The signal input unit 21 adjusts the offset according to the digital value cntl.

The differential signal lines 30 transfers the differential signals that is sent out from the signal output unit 11 of the transmission device 10, to the signal input unit 21 of the reception device 20. A resistor 33 is provided between a pair of signal lines that constitute the differential signal lines 30.

In a case where an AC connection is made between the transmission device 10 and the reception device 20, capacitors 31 and 32 are inserted into the pair of signal lines, respectively, that constitute the differential signal lines 30. In the case of the AC connection, the transmission device 10 outputs a constant voltage value to each of the pair of signal lines that constitute the differential signal lines 30, and thus can set the differential signals. Which arrives at the signal input unit 21 of the reception device 20, to a differential 0 V.

In a case where a DC connection is made between the transmission device 10 and the reception device 20, the capacitors 31 and 32 are unnecessary. In the case of the DC connection, the transmission device 10 outputs the voltage value to each of the pair of signal lines that constitute the differential signal lines 30, and thus can set the differential signals, which arrives at the signal input unit 21 of the reception device 20, to a differential 0 V.

The signal line 40 transfers the request signal from the request output unit 22 of the reception device 20 to the request input unit 12 of the transmission device 10. Because the request signal that is transferred by the signal line 40 may not require a high speed, a low-priced line for a low speed can be used as the signal line 40. Furthermore, in a case where a poor-quality cable, such as a flat cable, that causes high signal interference, is used between the transmission device 10 and the reception device 20, an excessive line that results from spacing the signal lines that constitute the differential signal lines 30 can be used as the signal line 40.

Figure 2:
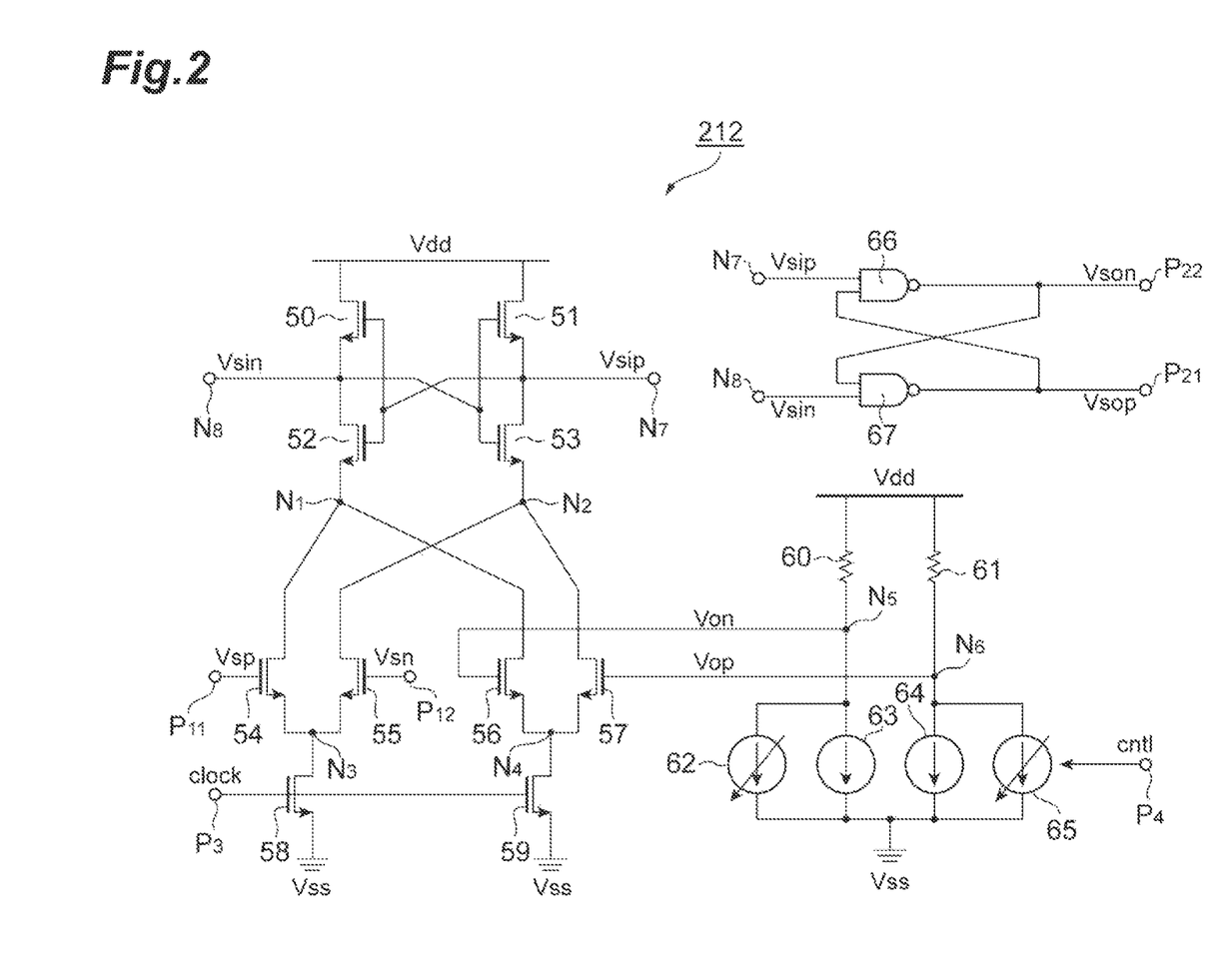
FIG. 2 is a diagram illustrating a circuit example of a sampler 211 in which an offset adjustment by a reception device 20 is possible.

Next, a circuit example of the sampler 212 in which an offset adjustment is possible will be described. FIG. 2 is a diagram illustrating the circuit example of the sampler 212 in which the offset adjustment by the reception device 20 is possible. The sampler 212 includes NMOS transistors 50 to 59, resistors 60 and 61, current sources 62 to 65, and NAND circuits 66 and 67. Furthermore, the sampler 212 has a first input terminal $P_{111}$ into which the signal Vsp that is output from the amplifier 211 is input, a second input terminal P12 into which the signal Vsn that is output from the amplifier 211 is input, a first output terminal. $P_{21}$ that outputs the data Vsop, a second output terminal $P_{22}$ that outputs the data Vson, a clock input terminal $P_3$ into which the clock is input, a digital value input terminal. P4 into which the digital value end that is output from the controller 242 is input, a first internal node $N_1$, a second internal node $N_2$, a third internal node $N_3$, a fourth internal node $N_4$, a fifth internal node $N_5$, a sixth internal node $N_6$, a seventh internal node $N_7$, and an eighth internal node $N_8$.

A drain of the NMOS transistor 50 is given the power supply potential Vdd, a source of the NMOS transistor 50 is connected to the eighth internal $N_8$, and a gate of the NMOS transistor 50 is connected to the seventh internal node $N_7$. A drain of the NMOS transistor 51 is given the power supply potential Vdd, a source of the NMOS transistor 51 is connected to the seventh internal $N_7$, and a gate of the NMOS transistor 51 is connected to the eighth internal node $N_8$.

A drain of the NMOS transistor 52 is connected to the eighth internal node $N_8$, a source of the NMOS transistor 52 is connected to the first internal node $N_1$, and a gate of the NMOS transistor 52 is connected to the seventh internal node $N_7$. A drain of the NMOS transistor 53 is connected to the seventh internal node $N_7$, a source of the NMOS transistor 53 is connected to the second internal node $N_2$, and a gate of the NMOS transistor 53 is connected to the eighth internal node $N_8$.

A drain of the NMOS transistor 54 is connected to the first internal node $N_1$, a source of the NMOS transistor 54 is connected to the third internal node $N_3$, and a gate of the NMOS transistor 54 is connected to the first input terminal P11. A drain of the NMOS transistor 55 is connected to the second internal node $N_2$, a source of the NMOS transistor 55 is connected to the third internal node $N_3$, and a gate of the NMOS transistor 55 is connected to the second input terminal P12.

A drain of the NMOS transistor 56 is connected to the first internal node $N_1$, a source of the NMOS transistor 56 is connected to the fourth internal node $N_4$, and a gate of the NMOS transistor 56 is connected to the fifth internal node $N_5$. A drain of the NMOS transistor 57 is connected to the second internal node $N_2$, a source of the NMOS transistor 57 is connected to the fourth internal node $N_4$, and a gate of the NMOS transistor 57 is connected to the sixth internal node $N_6$.

A drain of the NMOS transistor 58 is connected to the third internal node $N_3$, a source of the NMOS transistor 58 is given the ground potential $V_{SS}$, and a gate of the NMOS transistor 58 is connected to the clock input terminal $P_3$. A drain of the NMOS transistor 59 is connected to the fourth internal node $N_4$, a source of the NMOS transistor 59 is given the ground potential $V_{SS}$, and a gate of the NMOS transistor 59 is connected to the clock input terminal $P_3$.

The resistor 60 is provided between a power supply potential terminal and the fifth internal node $N_5$. The resistor 61 is provided between the power supply potential terminal and the sixth internal node $N_6$. The current sources 62 and 63 are provided between the fifth internal node $N_5$ and a ground potential terminal. Current sources 64 and 65 are provided between the sixth internal node $N_6$ and the ground power terminal. Constant current flows through current sources 63 and 64. An amount of current in accordance with the digital value ent1 that is input into the digital value input terminal P4 flows through the current source 62 and 65.

One input terminal of the NAND circuit 66 is connected to the seventh internal node $N_7$, the other input terminal of the NAND circuit 66 is connected to the first output terminal $P_{21}$, and an output terminal of the NAND circuit 66 is connected to the second output terminal $P_{22}$. One input terminal of the NAND circuit 67 is connected to the eight internal node $N_8$, the other input terminal of the NAND circuit 67 is connected to the second output terminal $P_{22}$, and an output terminal of the NAND circuit 67 is connected to the first output terminal $P_{21}$.

In the sampler 212 that is configured in this manner, current in accordance with the digital value cntl that is input into the digital value input terminal P4 flows through the current sources 62 and 65, and thus potential Von of the fifth internal node $N_5$ and potential Vop of the sixth internal node $N_6$ are also in accordance with the digital value cntl. The potential Von of the fifth internal node $N_5$ is given to the gate of the NMOS transistor 56 is given. The potential Vop of the sixth internal node $N_6$ is given to the gate of the NMOS transistor 57.

At a timing of a rising edge of a clock that is input into the clock input terminal $P_3$, sampling is performed on the differential signals Vsp and Vsn that are input into the input terminal $P_{11}$ and $P_{13}$, respectively, and the data Vsop and the data Vson are output from the output terminals $P_{21}$ and $P_{22}$, respectively. At the time of the sampling, due to a difference in potential between Vop and Von, deviation occurs in the difference in potential between Vsp and Vsn. An amount of the deviation is in proportion to the offset. Therefore, with the digital value cntl, the difference in potential between Vop and Von is adjusted, and thus the offset can be adjusted.

Next, an example of operation of the transmission/reception system it will be described. When the reception device 20 is powered on or powered off, the request output unit 22 causes the switch 23 to be in an off state and sets the potential of the signal line 40 be the first reference potential (the power supply potential Vdd), and thus sends the request signal to the transmission device 10. The request input unit 12 of the transmission device 10 detects that the potential of the signal line 40 is the first reference potential (the power supply potential Vdd), and knows that the request signal is sent and arrives from the reception device 20. Then, the signal output unit 11 of the transmission device 10 sends out the differential signals of a differential 0 V to the reception device 20. Alternatively, according to a state of the transmission device 10, the signal output unit 11 sends out the differential signals of a differential 0 V to the reception device 20, without being based on the request signal.

The signal input unit 21 of the reception device 20, which receives the differential signals of a differential 0 V, performs sampling on the differential signals at the timing that is designated by the clock, and thus generates the data Vsop and the data Vson. At this time, the differential signals on which the signal input unit 21 performs sampling is at a differential 0 V, but random noise is superimposed on the differential signals. Therefore, if the offset is at an ideal value of 0, the data Vsop and the data Vson reach a logical value of 0 and a logical value of 1, respectively, with the same frequency of occurrence. Thus, the adjustment unit 24 sets the digital value end that is to be given to the signal input unit 21, in such a manner that the data having a logical value of 1 and the data having a logical value of 0, which are output from the signal input unit 21, and thus adjusts the offset optimally in the signal input unit 21.

When the offset adjustment is ended, the adjustment unit 24 stores the digital value end that results when the adjustment is optimally made, and, for now on, gives the stored digital value cntl to the signal input unit 21. Furthermore, the request output unit 22 causes the switch 23 to be in an on state and sets the potential of the signal line 40 to be the second reference potential (the ground potential $V_{SS}$), and thus notifies the transmission device 10 that the offset adjustment is ended. Front now on, the signal output unit 11 of the transmission device 10 that has this notification can send out normal data, as the differential signals, to the reception device 20.

In this manner, in the transmission/reception system 1, the differential signals of a differential 0 V is sent from the signal output unit 11 of the transmission device 10 to the signal input unit 21 of the reception device 20, and the offset of the signal input unit 21 into which the differential signals of a differential 0 V is input is adjusted by the adjustment unit 24. At this time, all offsets of the signal input unit 21 that includes the amplifier 211 and the sampler 212 are adjusted.

Because the adjustment unit 24 can be configured with a digital circuit, a circuit area of, and power consumption by, the reception device 20 can be reduced compared with the configuration of the invention that is disclosed in Patent Document 1. Furthermore, while according to the invention that is disclosed in Patent Document 1, there is a need for a switch for short-circuiting the differential signals in the input terminal of the reception device, because the reception device 20 does not need the switch, high-speed differential transfer is possible with the offset adjustment without causing an increase in a load capacity of the input terminal.

Furthermore, the signal line 40 along which the request signal is transferred from the request output unit 22 of the reception device 20 to the request input unit 12 of the transmission device 10 is used in a manner that is exchangeable for a signal line for hot plugging detection. Because of this, there is no need to add a new signal line between the transmission device 10 and the reception device 20, and there is no need to add a circuit for transmitting and receiving the request signal or a small-sized circuit is necessary.

Next, the signal output unit 11 of the transmission device 10 will be described below in detail. The signal output unit 11 sends out the differential signal from each of the pair of output terminals $P_{111}$ and $P_{112}$ that are connected to the differential signal lines 30. A common voltage of each of the pair of output terminals $P_{111}$ and $P_{112}$ is constant over a state where no electric power is supplied and an idle state. Furthermore, in a case where the transmission device 10 can also be in a powered-down state, the common voltage of each of the pair of output terminals $P_{111}$ and $P_{112}$ is constant over the state where no electric power is supplied, the powered-down state, and the idle state. In this case, the offset adjustment in the reception device 20 can be made during a duration from the state where no electric power is supplied to the transmission device 10 (through the powered-down state) to the idle state. During the duration, a common voltage of the differential signals inputting into the reception device 20 does not change and the differential signals are stable at a differential 0 V. Because of this, it is possible that a precise offset adjustment is made in the reception device 20.

Alternatively, in a case where the signal output unit 11 has a configuration that includes a current mode driver, the common voltage of each of the pair of output terminals $P_{111}$ and $P_{112}$ may be constant at least over the state where no electric power is supplied and the powered-down state. In this case, during the duration from the state where no electric power is supplied to the transmission device 10 to the powered-down state, the offset adjustment may be made in the reception-on stat device 20. During the duration, the common voltage of the differential signals inputting into the reception device 20 does not change and the differential signals are stable at a differential 0 V. Because of this, it is possible that the precise offset adjustment is made in the reception device 20.

Furthermore, alternatively, in a state where the signal output unit 11 has a configuration that includes a voltage mode driver, the common voltage of each of the pair of output terminals $P_{111}$ and $P_{112}$ may be constant at least over the powered-down state and the idle state. In this case, during a duration from the state where the transmission device 10 is powered down to the idle state, the offset adjustment may be started and be ended in the reception device 20. During the duration, the common voltage of the differential signals inputting into the reception device 20 does not change and the differential signals are stable at a differential 0 V. Because of this, it is possible that the precise offset adjustment is made in the reception device 20.

It is noted that in any of the cases described above, a common voltage of the signal output unit 11 in the idle state preferably has the same value or as the common voltage in a normal data transmission state, but may be different from the common voltage in the normal data transmission state. Particularly, in a case where the signal output unit 11 includes the voltage mode driver, it is preferable that the common voltage in the idle state is the same or similar to the common voltage in the normal data transmission state.

Figure 3:
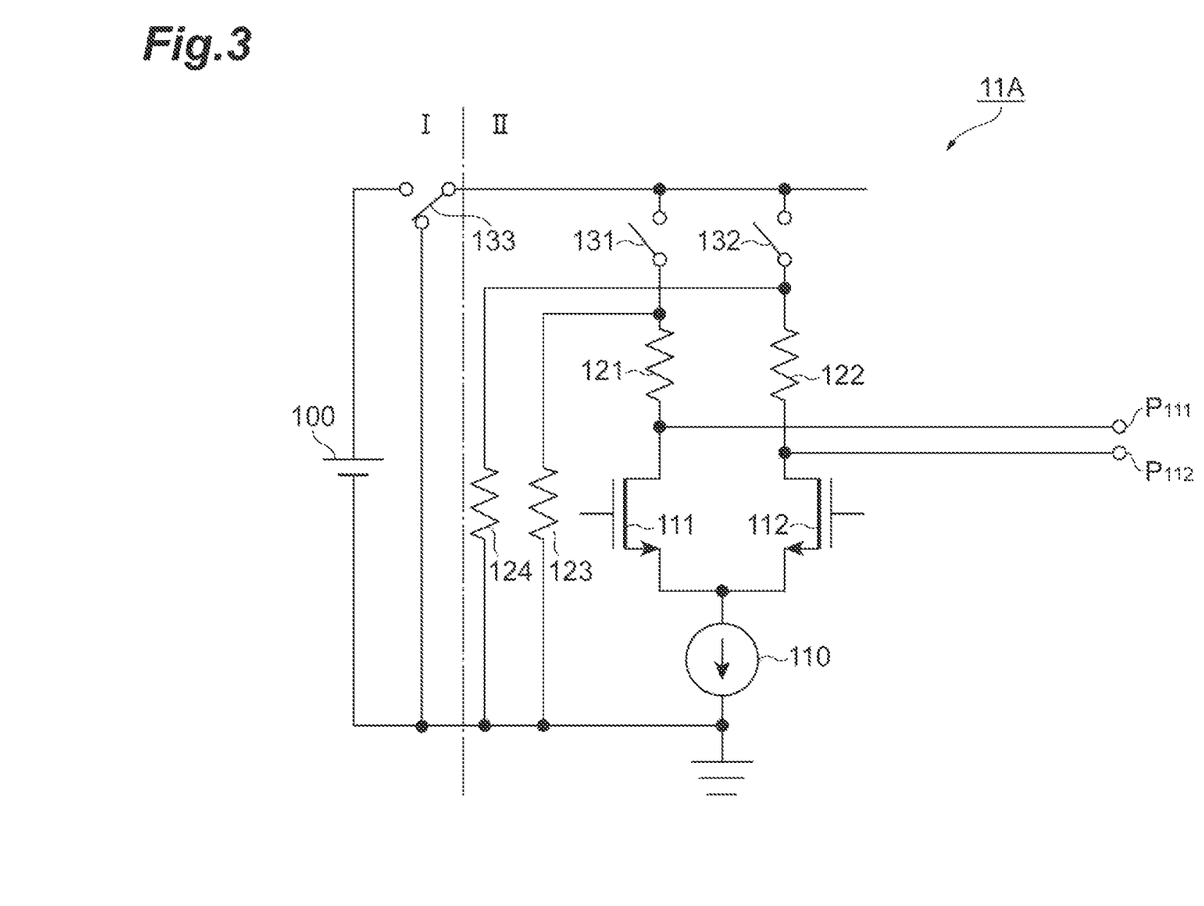
FIG. 3 is a diagram illustrating a first circuit example of a signal output unit 11 of a transmission device 10.

FIG. 3 is a diagram illustrating a first circuit example of the signal output unit 11 of the transmission device 10. A signal output unit 11A in the first circuit example that is illustrated in FIG. 3 has a Current Mode Logic (CML) configuration that includes the current mode driver. The signal output unit 11A includes a constant current source 110, NMOS transistors 111 and 112, resistors 121 to 124, and switches 131 to 133.

The constant current source 110 is provided between a source of each of the NMOS transistors 111 and 112, and a ground potential supply terminal. One terminal of the resistor 121 is connected to the output terminal $P_{111}$, and is connected to a drain of the NMOS transistor 111. The other terminal of the resistor 121 is connected to the ground potential supply terminal through the resistor 123, and is connected to a power supply 100 through the switch 131 and the switch 133. One terminal of the resistor 122 is connected to the output terminal $P_{112}$, and is connected to a drain of the NMOS transistor 112. The other terminal of the resistor 122 is connected to the ground potential supply terminal through the resistor 124, and is connected to the power supply 100 through the switch 132 and the switch 133. The switch 133 can select any of the power supply potential and the ground potential from the power supply 100, and can give the selected potential to the resistors 121 and 122 through the switches 131 and 132, respectively. A gate of each of the NMOS transistors 111 and 112 is given a voltage value in accordance with a signal that has to be transmitted.

The signal output unit 11A in the first circuit example, when the state where no electric power is supplied is reached, with operation of the switch 133, power is not supplied to the signal output unit 11A. Because of this, any potential of each of the pair of output terminals $P_{111}$ and $P_{112}$ is the ground potential (at a low (L) level) regardless of states of the switches 131 and 132.

When the powered-down state is reached, with the operation of the switch 133, power is supplied to the signal output unit 11A, but the constant current source 110 is in an off state and the switches 131 and 132 are in an off state. Accordingly, with pull-down operation of each of the high-resistivity resistors 123 and 124, any potential of each of the pair of output terminals $P_{111}$ and $P_{112}$ is the ground potential (at an L level).

When the idle state is reached, with the operation of the switch 133, power is supplied to the signal output unit 11A, and the constant current source 110 is in an on state and the switches 131 and 132 are in an off state. Accordingly, with the pull-down operation of each of the high-resistivity resistors 123 and 124, any potential of each of the pair of output terminals $P_{111}$ and $P_{112}$ is the ground potential (at the L level).

Figure 4:
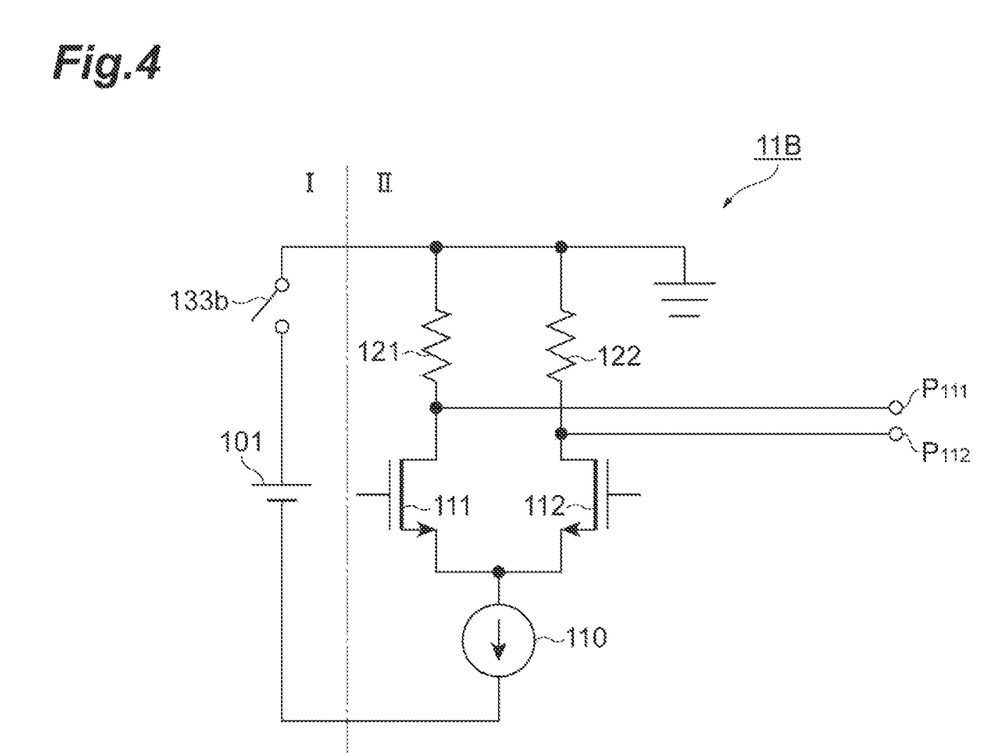
FIG. 4 is a diagram illustrating a second circuit example of the signal output unit 11 of the transmission device 10.

FIG. 4 is a diagram illustrating a second circuit example of the signal output unit 11 of the transmission device 10. A signal output unit 11B in the second circuit example that is illustrated in FIG. 4 has the MIL configuration that includes the current mode driver. The signal output unit 11B includes the constant current source 110, the NMOS transistors 111 and 112, and the resistors 121 and 122.

The constant current source 110 is provided between the source of each of the NMOS transistors 111 and 112, and the ground potential supply terminal. One terminal of the resistor 121 is connected to the output terminal $P_{111}$, and is connected to the drain of the NMOS transistor 111. The other terminal of the resistor 121 is connected to a power supply 101. One terminal of the resistor 122 is connected to the output terminal $P_{112}$, and is connected to the drain of the NMOS transistor 112. The other terminal of the resistor 122 is connected to the power supply 101. The gate of each of the NMOS transistors 111 and 112 is given a voltage value in accordance with a signal that has to be transmitted. The power supply 101 gives the ground potential (at an H level) to the resistors 121 and 122, and gives minus power supply potential (at the L level) to the constant current source 110.

In the signal output unit 11B in the second circuit example, when the state where no electric power is supplied is reached, any potential of each of the pair of output terminals $P_{111}$ and $P_{112}$ is the ground potential (at the H level). When the powered-down state is reached, power is supplied to the signal output unit 11B, and the NMOS transistors 111 and 112 are in an off state. Thus, any potential of each of the pair of output terminals $P_{111}$ and $P_{112}$ is the ground potential (at the H level). When the idle state is reached, power is supplied to the signal output unit 11B, the NMOS transistors 111 and 112 are hi an off state. Thus, any potential of each of the pair of output terminals $P_{111}$ and $P_{112}$ is the ground potential (at the H level).

Figure 5:
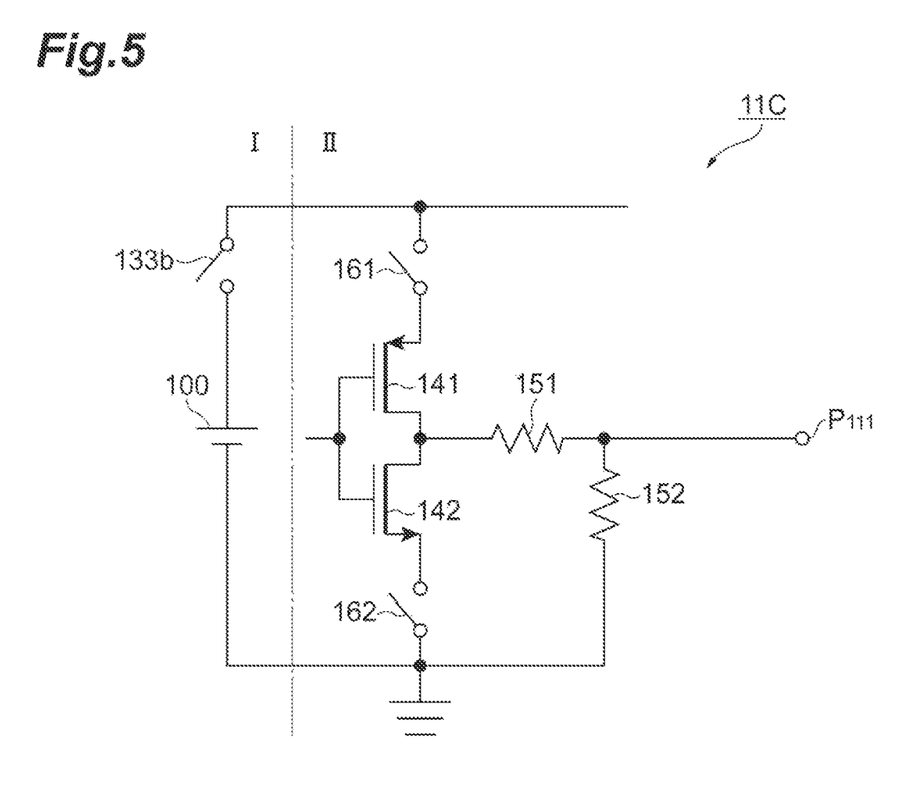
FIG. 5 is a diagram illustrating a third circuit example of the signal output unit 11 of the transmission device 10.

FIG. 5 is a diagram illustrating a third circuit example of the signal output unit 11 of the transmission device 10. A signal output unit 11C in the third circuit example that is illustrated in FIG. 5 has a Source Series Termination (SST) configuration that includes the voltage mode driver. Generally, the voltage mode driver includes a first partial circuit that outputs a signal from one of the pair of output terminals $P_{111}$ and $P_{112}$, the output terminal $P_{111}$, and a second partial circuit that outputs a signal from the other one, the output terminal $P_{112}$. The first partial circuit and the second partial circuit have the same configuration. FIG. 5 illustrates the first partial circuit that outputs the signal from the output terminal $P_{111}$. The signal output unit 11C includes a PMOS transistor 141, an NMOS transistor 142, resistors 151 and 152, and switches 161 and 162 in the first partial circuit.

Drains of the PMOS transistor 141 and the NMOS transistor 142 are connected to each other and are connected to the output terminal $P_{111}$ through the resistor 151. The power supply potential is given from the power supply 100 to a source of the PMOS transistor 141 through the switch 161. A source of the NMOS transistor 142 is given the ground potential through the switch 162. The resistor 152 is provided between the output terminal $P_{111}$ and the ground potential supply terminal. Gates of the PMOS transistor 141 and the NMOS transistor 142 are connected to each other, and are given a voltage value in accordance with a signal that has to be transmitted.

In the first partial circuit of the signal output unit 11C in the third circuit example, when the state where no electric power is supplied is reached, with pull-down operation of the high-resistivity resistor 152, the potential of the output terminal $P_{111}$ is the ground potential (at the L level) regardless of states of the switches 161 and 162. When the powered-down state and the idle state are reached, power is supplied to the signal output unit 11C, the switches 161 and 162 are in an on state, and, with the pull-down operation of the high-resistivity resistor 152, the potential of the output terminal $P_{111}$ is the ground potential (at the L level). The powered-down state and the idle state are different from each other in terms of an amount of power consumption in a circuit other than a circuit that is illustrated. The same is true for the second partial circuit of the signal output unit 11C in the third circuit example.

Figure 6:
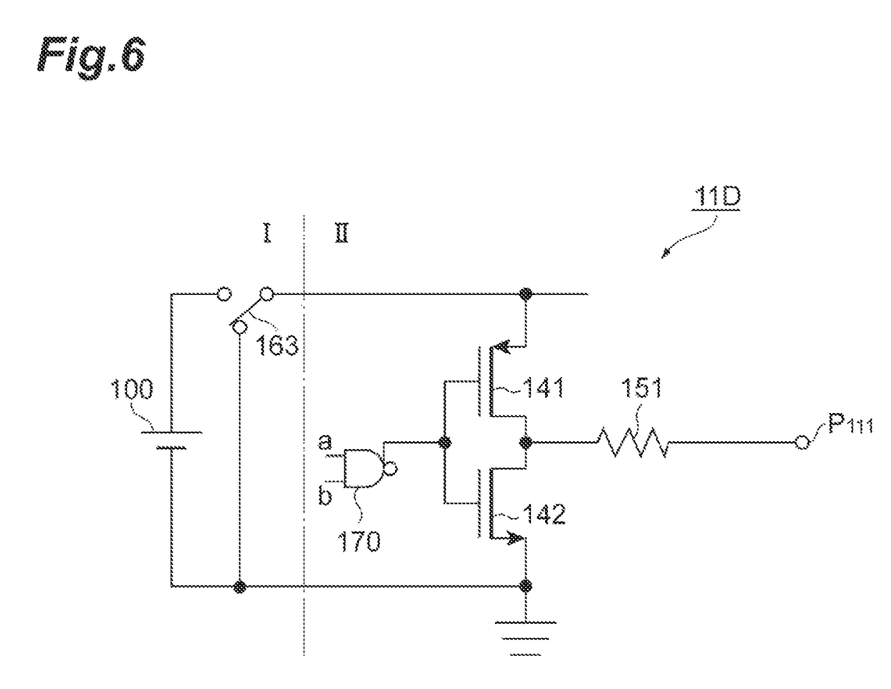
FIG. 6 is a diagram illustrating a fourth circuit example of the signal output unit 11 of the transmission device 10.

FIG. 6 is a diagram illustrating a fourth circuit example of the signal output unit 11 of the transmission device 10. A signal output unit 11D in the fourth circuit example that is illustrated in FIG. 6 has the SST configuration that includes the voltage mode driver. FIG. 6 also illustrates the first partial circuit that outputs a signal from the output terminal $P_{111}$, of the first partial circuit and the second partial circuit that have the same configuration. In the first partial circuit, the signal output unit 11D includes the PMOS transistor 141, the NMOS transistor 142, the resistor 151, a switch 163, and a gate circuit 170.

The drain of the PMOS transistor 141 and the NMOS transistor 142 are connected to each other, and are connected to the output terminal $P_{111}$ through the resistor 151. The source of the PMOS transistor 141 is connected to the power supply 100 through the switch 163. The source of the NMOS transistor 142 is given the ground potential. The switch 163 can select any of the power supply potential and the ground potential that are from the power supply 100, and can give the selected potential to the source of the PMOS transistor 141. The gates of the PMOS transistor 141 and the NMOS transistor 142 are connected to each other, and are given a voltage that is output from the gate circuit 170. The gate circuit 170 selects any of the voltage in accordance with the signal that has to be transmitted and a value of a high-level voltage, and gives the selected voltage value to each of the PMOS transistor 141 and the NMOS transistor 142.

In the first partial circuit of the signal output unit 11D in the fourth circuit example, when the state where no electric power is supplied is reached, with operation of the switch 163, power is not supplied to the signal output unit 11D. Because of this, the potential of the output terminal $P_{111}$ is the ground potential (at the L level). When the powered-down state and the idle state are reached, with the operation of the switch 163, power is supplied to the signal output unit 11D, and the gates of the PMOS transistor 141 and the NMOS transistor 142 are given the value of the high-level voltage from the gate circuit 170. Accordingly, the PMOS transistor 141 is in an off state, and the NMOS transistor 142 is in an on state. Thus, the potential of the output terminal $P_{111}$ is the ground potential (at the L level). The powered-down state and the idle state are different from each other in terms of an amount of power consumption, in a circuit other than a circuit that is illustrated. The same is true for the second partial circuit of the signal output unit 11D in the fourth circuit example.

Next, as a summary of the above-described embodiments, states thereof will be described in a supplementary manner.

(Supplementary Description with Reference to FIG. 3)

A chip of the transmission device is positioned on the right side (an area II) with respect to the power supply 100 (an area I) in FIG. 3.

A state where the switch 133 is connected to the ground potential (a cathode terminal of the power supply 100) is set to be OFF and a state where the switch 133 is connected to the power supply potential (an anode terminal of the power supply 100) is set to be ON. A state where current flows through the constant current source 110 is set to be ON, and a state where the current does not flow through the constant current source 110 is set to be OFF. A state of each of the elements of the transmission device 10, which are controlled by a control device within the transmission device 10 satisfies the following conditions.

(1) State where no power is supplied

State of the switch 133: OFF

Constant current source 110: OFF (a power of the power supply is not supplied to the constant current source itself)

Switches 131 and 132: OFF (the power of the power supply is not supplied to the switch itself)

It is noted that, in the state where no power is supplied, the cathode terminal of the power supply 100 is connected to the switches 131 and 132 through the switch 133. Because the power supply is not connected to the pair of output terminals $P_{111}$ and $P_{112}$, the potential of each of the output terminals is the ground potential.

(2) Powered-down state (a state of being driven by low power consumption)

State of the switch 133: ON

Constant current source 110: OFF

Switches 131 and 132: OFF

In the powered-down state, the anode terminal of the power supply 100 is connected to the switches 131 and 132 through the switch 133. However, the switches 131 and 132 are OFF, and the power supply is not connected to the pair of output terminals $P_{111}$ and $P_{112}$. Because of this, the potential of each of the output terminals is retained to the ground potential. That is, even during a duration immediately before signal transmission starts, the potential of each of the output terminals $P_{111}$ and $P_{112}$ can be constantly retained.

(3) Idle state

State of the switch 133: ON

Constant current source 110: ON

Switches 131 and 132: OFF

In the idle state, the anode terminal of the power supply 100 is connected to the switches 131 and 132 through the switch 133 and the constant current source 110 also operates, but the switches 131 and 132 remain OFF, and the power supply is not connected to the pair of the output terminals $P_{111}$ and $P_{112}$. Because of this, the potential of each of the output terminals is retained to the ground potential. That is, even during the duration immediately before the signal transmission starts, the potential of each of the output terminals $P_{111}$ and $P_{112}$ can be constantly retained. It is noted that the powered-down state (the low power consumption state) is a state where a power is supplied to the transmission device, and becomes a state where power consumption is lower than in the idle state because the constant current source 110 is OFF.

(4) Signal transmission state

State of the switch 133: ON

Constant current source 110: ON

Switches 131 and 132: ON

In a signal transmission state, in a case where one transistor 111, which is complementary, is set to be ON and the other transistor 112 is set to be OFF, a level of the output terminal $P_{111}$ is the L level and a level of the output terminal $P_{112}$ is the H level, and complementary differential signals are output from the output terminal. In a case where one transistor 111 is set to be OFF and the other transistor 112 is set to be ON, the level of the output terminal $P_{111}$ is the H level and the level of the output terminal $P_{112}$ is the L level, and the complementary differential signal is output from the output terminal.

(Supplementary Description with Reference to FIG. 4)

The chip of the transmission device is positioned on the right side (the area II) with respect to the power supply 101 (the area in FIG. 4, but in the same manner as the switch 133 in FIG. 3, a switch 133b is present between the anode of the power supply 101 and the chip (the resistor 121).

(1) State where no power is supplied
Switch 133b: OFF
Constant current source 110: OFF
NMOS transistors 111 and 112: OFF (no input)
(2) Powered-down state (the state of being driven by the low power consumption)
Switch 133b: ON
Constant current source 110: OFF
NMOS transistors 111 and 112: OFF (an input of 0)
(3) Idle state
Switch 133b: ON
Constant current source 110: ON
NMOS transistors 111 and 112: OFF (an input of 0)
(4) Signal transmission state
Switch 133b: ON
Constant current source 110: ON
NMOS transistors 111 and 112: (inputs of the complementary differential signals)

It is noted that in a case where a configuration in which the same operation and effect as in a switch 133b are achieved is employed, the switch 133b can be omitted.

(Supplementary Description with Reference to FIG. 5)

The chip of the transmission device is positioned on the right side (the area II) with respect to the power supply 100 (the area I) in FIG. 5, but in the same manner as the switch 133 in FIG. 3, the switch 133b is present between the anode of the power supply 100 and the chip (a switch 161). In the present example, the current source that is illustrated in FIG. 3 is not present.

(1) State where no power is supplied
Switch 133b: OFF
Switches 161 and 162: OFF
(2) Both the powered-down state (the state of being driven by low power consumption) and the idle state
Switch 133b: ON
Switches 161 and 162: OFF
(3) Signal transmission state
Switch 133b: ON
Switches 161 and 162: ON In FIG. 5, one signal that is a complementary differential signal is input into gates of transistors 141 and 142. The transmission device further includes a separate circuit that has the same configuration as a circuit that is illustrated in FIG. 5, and the other signal that is a complementary differential signal is input into the gates of the transistors 141 and 142 in the separate circuit. Because the current source is not present in the case of a configuration in FIG. 5, there is no need to perform ON/OFF control of this, and during the duration immediately before the signal transmission starts, potential of the output terminal $P_{111}$ (the output terminal $P_{112}$ in the separate circuit) of the present circuit is retained to the ground potential.

It is noted that in a case where a configuration in which the same operation and effect as in a switch 133b are achieved is employed, the switch 133b can be omitted.

(Supplementary Description with Reference to FIG. 6)

The chip of the transmission device is positioned on the right side (the area II) with respect to the power supply 100 (the area I) in FIG. 6, but in the same manner as the switch 133 in FIG. 3, the switch 163 is present between the anode of the power supply 100 and the chip (the transistor 141). It is noted that the state where the switch 163 is connected to the ground potential (the cathode terminal of the power supply 100) is set to be OFF and the state where the switch 163 is connected to the power supply potential (the anode terminal of the power supply 100) is set to be ON. In the present example, the current source that is illustrated in FIG. 3 is not present. In FIG. 6, one signal that is a complementary differential signal is input into one input terminal of a NAND circuit 180. The transmission device further includes a separate circuit that has the same configuration as a circuit that is illustrated in FIG. 6, and the other signal that is a complementary differential signal is input into one input terminal of the NAND circuit 1180 in the separate circuit. In any circuit, a NAND circuit 170 includes two input terminals, input terminals a and b. One signal that is a complementary differential signal is input into one input terminal a and a powered-down control signal is input into the other input terminal b. In a case where the powered-down control signal is at the L level, an output of the NAND circuit 170 is at the H level, the PMOS transistor 141 is set to be OFF, the NMOS transistor 142 is set to be ON, and the potential of the output terminal $P_{111}$ (and the output terminal $P_{112}$ in the separate circuit) the ground potential.

(1) State where no power is supplied
State of the switch. 163: OFF
Powered-down control signal: at the L level
(2) Both the powered-down state (the state of being driven by the low power consumption) and the idle state
State of the switch 163: OFF
Powered-down control signal: at the L level
(3) Signal transmission state
Switch 163: ON
Powered-down control signal: at the H level In the signal transmission state, the powered-down control signal is at the H level, an output of a NAND circuit 170 is the reverse of an input signal to the NAND circuit, and the potential of the output terminal $P_{111}$ (and the output terminal $P_{112}$ in the separate circuit) changes according to the input signal.

Furthermore, the sampler 212 is a comparator, and an offset at the time of the differential signal sampling that is adjusted by the offset adjuster means a deviation from a suitable reference input of the comparator. In a case where outputs of the comparator, that is, values of the differential signals that are sampled, are set to be A and B, and in a case where during a prescribed duration, the number of logical values of 1 and the number of logical values of 0 are counted and thus the counted number of logical values of 1 and the counted number of logical values of 0 are set to be N1 and N2, respectively, the control circuit feedback-controls a value of a control voltage (cntl) that is added to the reference input of the comparator and adjusts the offset, in such a manner that N1=N2.

It is noted that differential signals at a differential voltage of 0 V (Differential Mode Voltage=0 V) mean that, in a case where the values of the differential signals at a certain timing are set to be A and B (A>B), A and B have a value complementary to a common mode voltage C, which serves as a reference, and that A−C=0 V. It is noted that, in the above description, a common voltage is also referred to as the common mode voltage, and that, for the common voltage, center voltages of the differential signals are stipulated for the differential signals. If the potential (a voltage) of the output terminal $P_{111}$ is set to be A and a potential (a voltage) of the output terminal $P_{112}$ is set to be B, the common mode voltage C=(A+B)/2. Furthermore, the above-described configuration can also be used in a Low Voltage Differential Signaling (LVDS). Furthermore, the above-described control can be performed by a suitable control device, but a function of the control device can be performed by a Central Processing Unit (CPU) that performs processing and a memory in which a control program is stored, or can be performed using a logic integrated circuit or the like that has the same function as the control device.

What is claimed is:

1. A transmission device comprising:
    a signal transmitter configured to transmit differential signals from a pair of output terminals that are respectively connected to differential signal lines; and
    a request receiver configured to be a receiver into which to input a request signal that makes a request to send out the differential signals for adjusting an offset when differential signal sampling is performed in a reception device that is connected through the differential signal lines,
    wherein the signal transmitter includes a current mode driver, and a common voltage of the pair of output terminals is constant over a state where no electric power is supplied to the transmission device and a powered-down state; and
    wherein the signal transmitter sends out differential signals of a differential 0 V to the reception device based on the request signal that is input into the request receiver.

2. The transmission device according to claim 1,
    wherein the common voltage of the pair of output terminals is constant over the state where no electric power is supplied to the transmission device, a powered-down state and the idle state.

3. A transmission device comprising:
    a signal transmitter configured to transmit differential signals from a pair of output terminals that are respectively connected to differential signal lines; and
    a request receiver configured to be a receiver into which to input a request signal that makes a request to send out the differential signals for adjusting an offset when differential signal sampling is performed in a reception device that is connected through the differential signal lines,
    wherein the signal transmitter includes a voltage mode driver and a common voltage of the pair of output terminals is constant over a powered-down state and an idle state; and
    wherein the signal transmitter sends out differential signals of a differential 0 V to the reception device based on the request signal that is input into the request receiver.

4. The transmission device according to claim 3,
    wherein the common voltage of the pair of output terminals is constant over the state where no electric power is supplied to the transmission device, a powered-down state and the idle state.

5. A transmission device comprising:
    a signal transmitter configured to transmit differential signals from a pair of output terminals that are respectively connected to differential signal lines; and
    a request receiver configured to be a receiver into which to input a request signal that makes a request to send out the differential signals for adjusting an offset when differential signal sampling is performed in a reception device that is connected through the differential signal lines,
    wherein a common voltage of the pair of output terminals is constant over a state where no electric power is supplied to the transmission device and an idle state; and
    wherein the signal transmitter sends out differential signals of a differential 0 V to the reception device based on the request signal that is input into the request receiver.

6. A transmission/reception system comprising:
    the transmission device according to claim 5; and
    a reception device connected to the transmission device through differential signal lines,
    wherein the reception device includes:
        a signal receiver configured to be a receiver into which to input differential signals sent out from the transmission device to the differential signal lines and configured in such a manner that data is generated by performing sampling on the differential signals at a timing that is designated by a clock, and an offset is adjustable at the time of the differential signal sampling,
        a request transmitter configured to send out a request signal that makes a request to the transmission device to send out differential signals for adjusting the offset, to the transmission device, and
        an offset adjuster configured to adjust the offset based on data that is output from the signal receiver, when differential signals of a differential 0 V that is sent out from the transmission device is input into the signal receiver, after the request transmitter sends out the request signal.

7. The transmission/reception system according to claim 6, further comprising:
    a signal line for transmitting a request signal from the reception device to the transmission device, the signal line being connected to a first reference potential terminal through a resistor on the transmission device side, and being connected to a second reference potential terminal through a switch on the reception device side, wherein the request signal is transmitted by the reception device in response to an opened or closed state of the switch.

8. The transmission/reception system according to claim 6,
    wherein an excessive line that makes a space between the differential signal lines is used as the signal line that transmits the request signal from the reception device to the transmission device, the excessive line transmitting the differential signals from the transmission device to the reception device.

9. The transmission device according to claim 5,
    wherein the common voltage of the pair of output terminals is constant over the state where no electric power is supplied to the transmission device, a powered-down state and the idle state.

10. A transmission/reception system comprising:
    a transmission device; and
    a reception device that is connected to the transmission device through differential signal lines,
    wherein the transmission device includes:
        a signal transmitter configured to transmit differential signals from a pair of output terminals that are respectively connected to differential signal lines, wherein a common voltage of the pair of output terminals is constant over a state where no electric power is supplied to the transmission device and an idle state; and wherein the reception device includes:
- a signal receiver configured to be a receiver into which to input differential signals sent out from the transmission device to the differential signal lines and configured in such a manner that data is generated by performing sampling on the differential signals at a timing that is designated by a clock, and an offset is adjustable at the time of the differential signal sampling, and
- an offset adjuster configured to adjust the offset based on data that is output from the signal receiver, when differential signals of a differential 0 V sent out from the transmission device is input into the signal receiver.

11. The transmission/reception system according to claim 10,
wherein, when the differential signals of the differential 0 V that is sent out from the transmission device is input into the signal receiver, the offset adjuster adjusts the offset in such a manner that data having a logical value of 1 and data having a logical value of 0 are output, with the same frequency of occurrence, by the differential signal sampling in the signal receiver.

12. The transmission device according to claim 10,
wherein the common voltage of the pair of output terminals is constant over the state where no electric power is supplied to the transmission device, a powered-down state and the idle state.

13. A transmission/reception system comprising:
a transmission device; and
a reception device that is connected to the transmission device through differential signal lines,
wherein the transmission device includes:
- a signal transmitter configured to transmit differential signals from a pair of output terminals that are respectively connected to differential signal lines,
- wherein the signal transmitter includes a current mode driver, and a common voltage of the pair of output terminals is constant over a state where no electric power is supplied to the transmission device and a powered-down state;

wherein the reception device includes:
- a signal receiver configured to be a receiver into which to input differential signals sent out from the transmission device to the differential signal lines and configured in such a manner that data is generated by performing sampling on the differential signals at a timing that is designated by a clock, and an offset is adjustable at the time of the differential signal sampling, and
- an offset adjuster configured to adjust the offset based on data that is output from the signal receiver, when differential signals of a differential 0 V sent out from the transmission device is input into the signal receiver.

14. A transmission/reception system comprising:
a transmission device; and
a reception device that is connected to the transmission device through differential signal lines,
wherein the transmission device includes:
- a signal transmitter configured to transmit differential signals from a pair of output terminals that are respectively connected to differential signal lines,
- wherein the signal transmitter includes a voltage mode driver and a common voltage of the pair of output terminals is constant over a powered-down state and an idle state;

wherein the reception device includes:
- a signal receiver configured to be a receiver into which to input differential signals sent out from the transmission device to the differential signal lines and configured in such a manner that data is generated by performing sampling on the differential signals at a timing that is designated by a clock, and an offset is adjustable at the time of the differential signal sampling, and
- an offset adjuster configured to adjust the offset based on data that is output from the signal receiver, when differential signals of a differential 0 V sent out from the transmission device is input into the signal receiver.

* * * * *